United States Patent
Yu et al.

(10) Patent No.: US 7,803,690 B2
(45) Date of Patent: Sep. 28, 2010

(54) EPITAXY SILICON ON INSULATOR (ESOI)

(75) Inventors: Ming-Hua Yu, Hsinchu (TW);
Tze-Liang Lee, Hsin-Chu (TW);
Pang-Yen Tsai, Jhu-bei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 609 days.

(21) Appl. No.: 11/521,667

(22) Filed: Sep. 15, 2006

(65) Prior Publication Data
US 2007/0298593 A1    Dec. 27, 2007

Related U.S. Application Data

(60) Provisional application No. 60/816,029, filed on Jun. 23, 2006.

(51) Int. Cl.
*H01L 21/76* (2006.01)
(52) U.S. Cl. .............. 438/413; 438/429; 438/481; 438/504; 257/E21.546
(58) Field of Classification Search .......... 438/413, 438/429, 481, 969, 492, 498, 504; 257/E21.546
See application file for complete search history.

(56) References Cited

U.S. PATENT DOCUMENTS

| | | | | |
|---|---|---|---|---|
| 4,400,411 A | | 8/1983 | Yuan et al. | |
| 4,507,158 A | * | 3/1985 | Kamins et al. | 438/413 |
| 4,619,033 A | * | 10/1986 | Jastrzebski | 438/226 |
| 5,185,286 A | * | 2/1993 | Eguchi | 438/400 |
| 5,876,497 A | | 3/1999 | Atoji | |
| 6,103,009 A | | 8/2000 | Atoji | |
| 2006/0157708 A1 | * | 7/2006 | Shin | 257/66 |
| 2007/0218659 A1 | * | 9/2007 | Spencer et al. | 438/497 |

* cited by examiner

*Primary Examiner*—Mary Wilczewski
*Assistant Examiner*—Toniae M Thomas
(74) *Attorney, Agent, or Firm*—Slater & Matsil, L.L.P.

(57) ABSTRACT

Methods and structures for semiconductor devices with STI regions in SOI substrates is provided. A semiconductor structure comprises an SOI epitaxy island formed over a substrate. The structure further comprises an STI structure surrounding the SOI island. The STI structure comprises a second epitaxial layer on the substrate, and a second dielectric layer on the second epitaxial layer. A semiconductor fabrication method comprises forming a dielectric layer over a substrate and surrounding a device fabrication region in the substrate with an isolation trench extending through the dielectric layer. The method also includes filling the isolation trench with a first epitaxial layer and forming a second epitaxial layer over the device fabrication region and over the first epitaxial layer. Then a portion of the first epitaxial layer is replaced with an isolation dielectric, and then a device such as a transistor is formed second epitaxial layer within the device fabrication region.

20 Claims, 5 Drawing Sheets

EPITAXY SILICON ON INSULATOR (ESOI)

This application claims the benefit of U.S. Provisional Application No. 60/816,029, filed on Jun. 23, 2006, Epitaxy Silicon on Insulator (ESOI), which application is hereby incorporated herein by reference.

TECHNICAL FIELD

This invention relates generally to semiconductor fabrication and more particularly to methods and structures for forming shallow trench isolation (STI) regions in silicon-on-insulator (SOI) substrates.

BACKGROUND

Conventional silicon-on-insulator (SOI) CMOS devices typically have a thin layer of silicon, also known as the active layer, on an insulator layer such as a buried oxide (BOX) layer. Active devices, such as MOS transistors (MOSFETs), are formed in active regions within the active layer. The size and placement of the active regions are defined by isolation regions, such as shallow trench isolation (STI) regions. Active devices in the active regions are isolated from the substrate by the BOX layer.

Devices formed on SOI substrates exhibit many improved performance characteristics over their bulk substrate counterparts. SOI substrates are particularly useful in reducing problems relating to reverse body effects, device latch-up, soft-error rates, and junction capacitance. SOI technology therefore enables higher speed performance, higher packing density, and reduced power consumption.

Currently, there are several techniques available for the fabrication of SOI substrates. One technique is known as "separation by implantation of oxygen" (SIMOX), where oxygen is implanted below the silicon surface and the substrate is annealed to provide a buried silicon oxide layer with a silicon overlayer. The implantation time can be intensive and cost prohibitive. Moreover, the SOI substrate may be exposed to high surface damage and contamination. A second technique is known as "bond-and-etch-back" SOI (BESOI), where an oxidized wafer is first diffusion-bonded to an unoxidized wafer, and the backside of the oxidized wafer is then grinded, polished, and etched to the desired device layer. The BESOI approach may be free from the implant damage inherent in the SIMOX approach. However, a time consuming sequence of grinding, polishing, and etching may be required. Another technique is known as the hydrogen implantation and separation approach, where hydrogen is implanted into silicon with a thermally grown oxide to form embrittlement of the silicon substrate underneath the oxide layer. The implanted wafer may then be bonded with another silicon wafer with an oxide overlayer. The bonded wafer may be cut across the wafer at the peak location of the hydrogen implant by appropriate annealing. These fabrication techniques may not be suitable for fabricating fully-depleted SOI substrates, since the uniform thickness of the silicon layer of a SOI substrate may be difficult to achieve.

Advanced CMOS fabrication typically also includes forming isolation regions between different devices. For example, some conventional CMOS hybrid orientation methods include fabricating isolation regions, e.g., shallow trench isolation (STI) regions, before the step of forming an epitaxial silicon layer. This particular fabrication sequence leads to problems. The differential etch rates among various isolation and semiconductor materials complicates the manufacturing of such CMOS devices. Accordingly, conventional CMOS manufacturing methods that include forming STI regions on SOI substrates suffer yield losses from etching of isolation regions.

What are needed then are more robust manufacturing methods and device structures to more effectively integrate CMOS isolation structures and SOI hybrid orientation technology.

SUMMARY OF THE INVENTION

These and other problems are generally solved or circumvented, and technical advantages are generally achieved, by preferred embodiments of the present invention that provide methods and structures for semiconductor devices having STI regions in SOI substrates. In on aspect, the present invention provides for a method of forming a semiconductor device. The method includes forming a dielectric layer over a substrate and patterning the dielectric layer to form a trench therein. The method further includes epitaxially growing a first epitaxial layer in the trench while preventing growth of the first epitaxial layer on the dielectric layer, and epitaxially growing a second epitaxial layer on said first epitaxial layer and extending over the dielectric layer.

In another aspect, the present invention provides for a method of forming a semiconductor device including providing a silicon containing substrate and forming a silicon oxide layer on the substrate. Openings are formed in the silicon oxide layer to expose regions of underlying substrate. A first silicon containing material is epitaxially grown on the exposed regions of underlying substrate while formation of the first silicon containing material on the silicon oxide layer is precluded. A second silicon containing material is epitaxially grown on the first silicon containing material, the second silicon containing material substantially covering the silicon oxide layer.

Structures resulting from the above described methods are also provided for in other aspects of the present invention.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and specific embodiment disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which.

Corresponding numerals and symbols in different figures generally refer to corresponding parts unless otherwise indicated. The figures are drawn to clearly illustrate the relevant aspects of the preferred embodiments and are not necessarily drawn to scale. To more clearly illustrate certain embodiments, a letter indicating variations of the same structure, material, or process step may follow a figure number.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that may be embodied in a wide variety of specific contexts. The specific embodiments discussed are merely illustrative of specific ways to make and use the invention, and do not limit the scope of the invention.

Exemplary structures and methods are provided below for fabricating a metal oxide semiconductor field effect transistor (MOSFET) according to embodiments of the invention. Although the exemplary embodiments are described as a series of steps, it will be appreciated that this is for illustration and not for the purpose of limitation. For example, some steps may occur in a different order than illustrated yet remain within the scope of the invention. In addition, not all illustrated steps may be required to implement the present invention. Furthermore, the structures and methods according to embodiments of the invention may be implemented in association with the fabrication or processing of other semiconductor structures not illustrated.

Figure 1A:
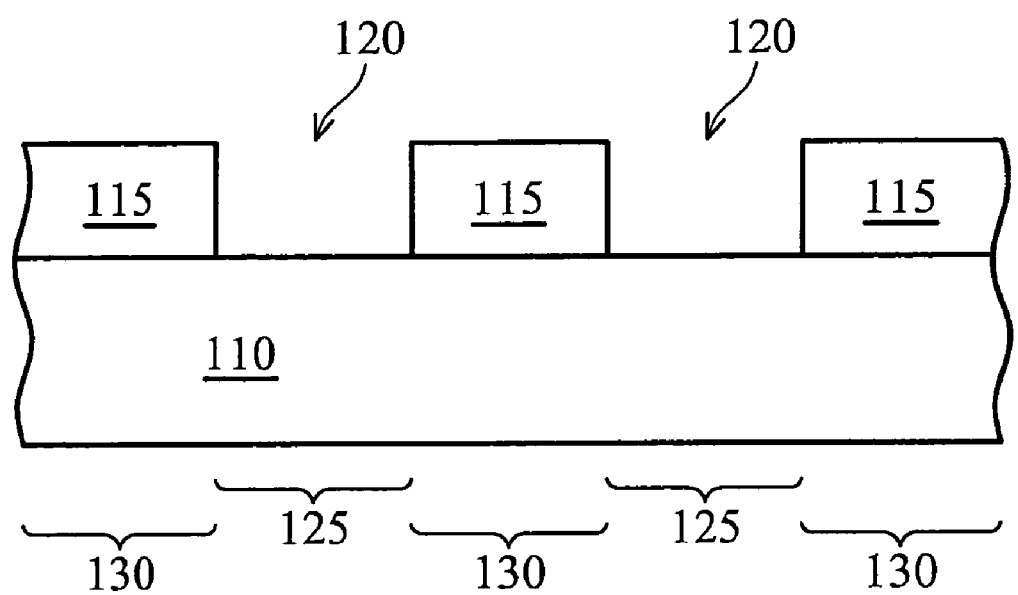
FIGS. 1a and 1b are cross sectional and plan views, respectively, of SOI and STI regions of an embodiment of the invention.

FIG. 1a depicts a cross sectional view of a semiconductor device such as a MOSFET at an intermediate fabrication stage. A semiconductor substrate 110 is preferably a silicon wafer, although the substrate 110 may alternatively comprise any one of Ge, SiGe, strained silicon, strained germanium, GaAs, or other semiconductor, or combinations thereof. A dielectric layer 115 is formed over the substrate.

The dielectric layer 115 preferably comprises silicon oxide, which may be formed by thermal oxidation at a temperature between about 600° C. and 1100° C. and at a pressure between about 1 torr and 10 torr in an oxidizing ambient. The dielectric layer 115 may also be formed using a technique such as chemical vapor deposition (CVD). It is preferably between about 100 Å and 10,000 Å thick. A plurality of openings 120 is formed through the dielectric layer 115 to the substrate 110. The openings 120 may be formed, for example, with a conventional masking and etching process, such as a patterned photoresist step followed with a buffered HF etch. Other dielectrics, such of silicon nitride, silicon oxynitride, doped or undoped polysilicon glass, or so-called high-k dielectrics, or so-called low-k dielectrics are also within the contemplated scope of the present invention.

Figure 1B:
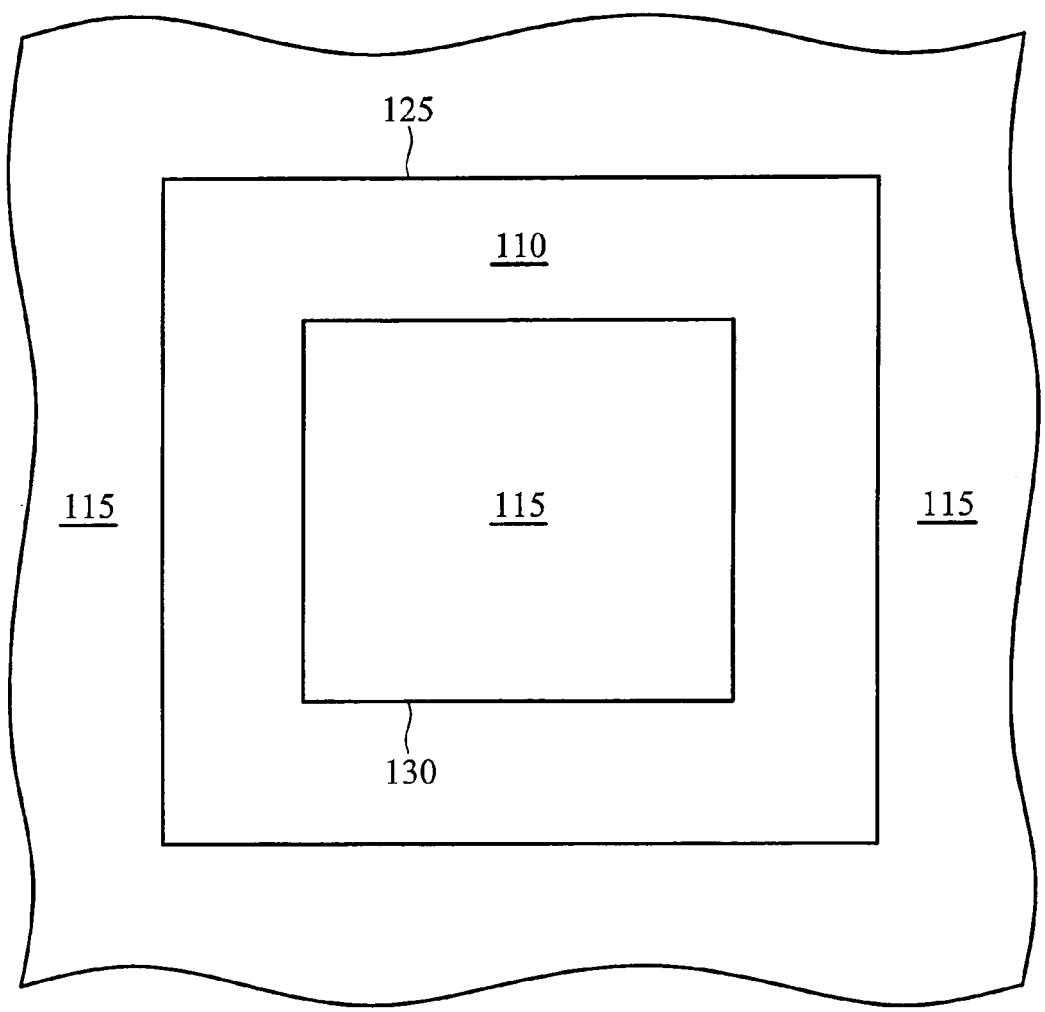

Turning now to FIG. 1b, there is illustrated a plan view of a portion of the structure shown in FIG. 1a. The openings 120 define isolation trench regions 125, which are formed after further processing as described below according to embodiments of the invention. Additionally, the spacing between the openings 120 define subsequent silicon-on-insulator (SOI) island regions 130 as described below. While the trench is illustrated as a simple rectangular structure, one skilled in the art will recognize that the specific size, shape, and placement of the trench or trenches is a matter of design choice. Annular, elliptical, oval, elongated, and complex shapes are within the scope of the present invention. Additionally, although only one trench is shown in FIG. 1b for purposes of illustrated, numerous trenches, which may or may not be intersecting, will typically be employed in embodiments of the invention.

Figure 2:
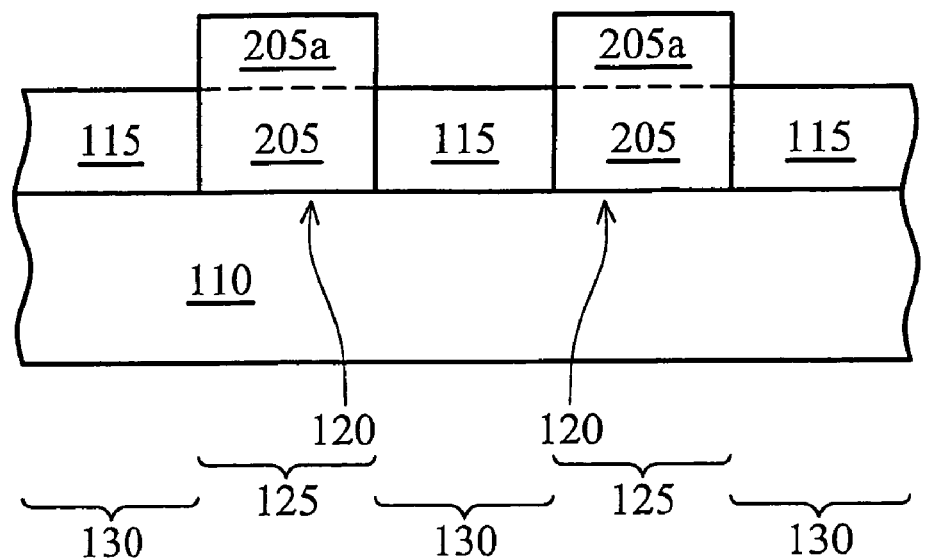
FIGS. 2 and 3 is are cross sectional views of seeded and selective lateral overgrowth epitaxy layers.

Turning now to FIG. 2, a first epitaxial layer 205 is formed on the portion of the substrate 110 exposed by the openings 120. Preferably, the epitaxial process is a high temperature (preferably above 800° C.) process using a silane based precursor gas providing silicon deposition at low pressure. Preferably, HCl or other suitable etchant is introduced during the deposition process to ensure the epitaxial growth is selective to the exposed silicon areas and does not occur on the exposed dielectric areas. Variations to the epitaxial growth process will be apparent to those skilled in the art with routine experimentation. The first epitaxial layer 205 preferably comprises the same material as the substrate 110 and has the same crystallographic orientation. It may be formed using any suitable technique, such as LPCVD, PECVD, or ALD, for example. In an embodiment, the first epitaxial layer 205 may comprise silicon, germanium, carbon, and combinations thereof. For example, the first epitaxial layer 205 may comprise silicon, silicon germanium, silicon carbon, and combinations thereof. The first epitaxial layer 205 may also be formed of gallium arsenide.

The epitaxy precursors may include a silicon-containing compound and a chlorine-containing ambient, preferably dichlorosilane, $SiCl_2H_2$, in a hydrogen chloride, HCl, ambient. Such an epitaxy precursor composition is preferred because it suppresses spurious nucleation at the surface of the dielectric layer 115. As shown in FIG. 2, an overfill portion 205a of the first epitaxial layer 205 preferably overfills the openings 120.

Figure 3:
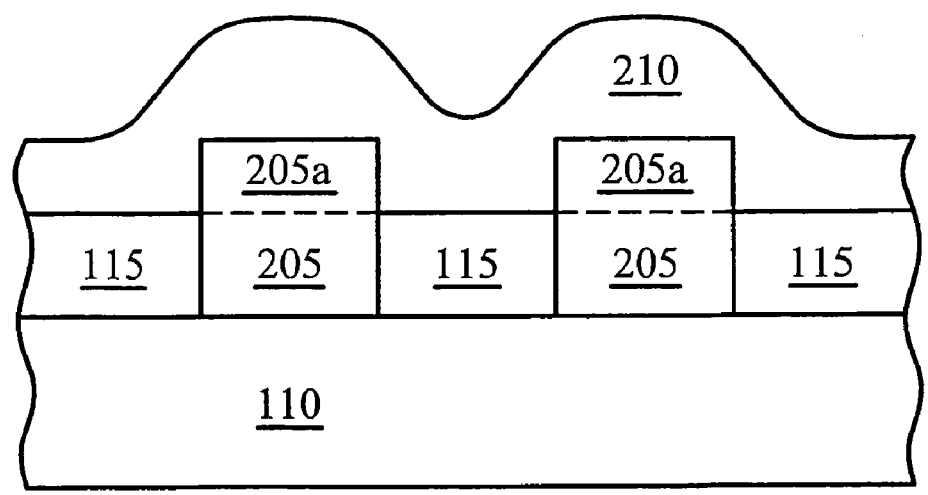

Turning now to FIG. 3, using the overfill 205a of the first epitaxial layer 205 as a seed region, or nucleation site region, a second epitaxial layer 210 is formed on the dielectric layer 115. As noted above, the preferred epitaxy precursor composition advantageously suppresses spurious nucleation on the surface of the dielectric layer 115. As such, the growth of the second epitaxial layer 210 proceeds laterally from overfill 205a of the first epitaxial layer 205 and extends over the surface of the dielectric layer 115. Given that the first epitaxial layer 205 provides the seed for the second epitaxial layer 210, these two layers preferably have the same crystallographic orientation and together form a single, continuous layer. Therefore, one skilled in the art will understand that describing embodiments as having two separate or physically distinguishable epitaxial layers is for ease of illustration only.

Figure 4A:
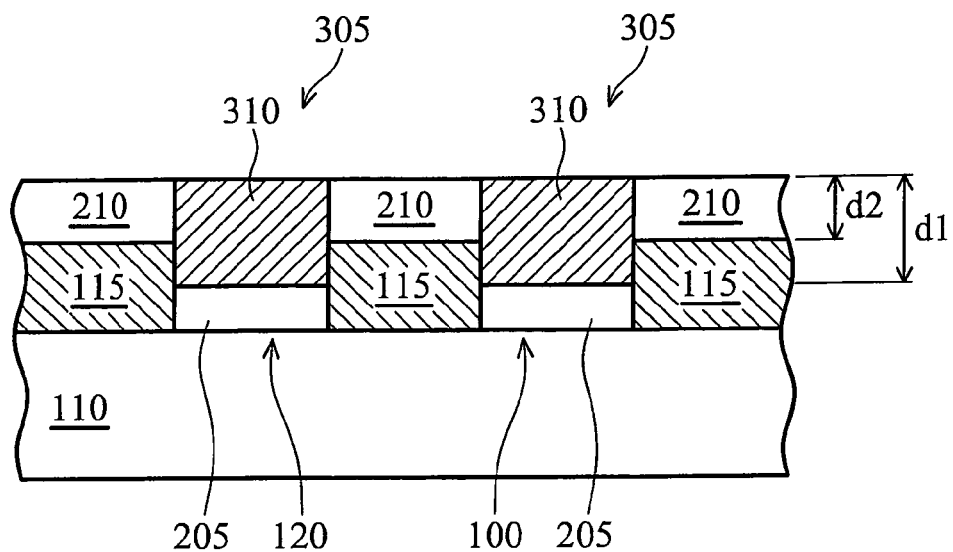
FIGS. 4a and 4b are cross sectional and plan views, respectively, of SOI and STI regions of an embodiment of the invention.

Turning now to FIG. 4a, the intermediate structure of FIG. 3 is planarized. A trench 305 (more accurately, a plurality of trenches 305) is anisotropically etched in the first epitaxial layer 205. The trench 305 may be formed using a reactive ion etch (RIE) or other dry etch, an anistropic wet etch, or any other suitable anisotropic etch or patterning process. A trench 305 depth, d1, may be greater than a thickness, d2, of the second epitaxial layer 210, i.e., d1>d2 as shown in FIG. 4a. Preferably, the photomask used for forming trenches 305 is the same mask that was employed for forming trenches 120. In this way trenches 305 will be aligned with the edges of dielectric layer 115. In alternative embodiments, a different photomask could be employed, and trenches 305 need not extend laterally to the edge of dielectric layer 115.

In keeping with preferred embodiments of the invention, the trench 305 need not be formed completely through the first epitaxial layer 205 to the substrate 110. That is, a portion of the first epitaxial layer 205 remains buried beneath the trench 305 as shown in FIG. 4a. As further illustrated in FIG. 4a, trench 305 is filled with isolation dielectric 310. The isolation dielectric is shown as substantially completely filling trench 305 and being planar with surrounding dielectric epitaxial silicon layer 210. One skilled in the art will recognize that this planarity can be obtained in a variety of manners, including overfilling trench 305, followed by a chemical mechanical polish (CMP) or etch back step to planarize isolation dielectric 310. Note that the combination of dielectric layer 115 and 310 completely surround and hence electrically isolate the disparate regions of silicon layer 210. Hence, in this manner, electrically isolated islands are formed which constitute the active regions for subsequently formed semiconductor devices and integrated circuits.

Figure 4B:
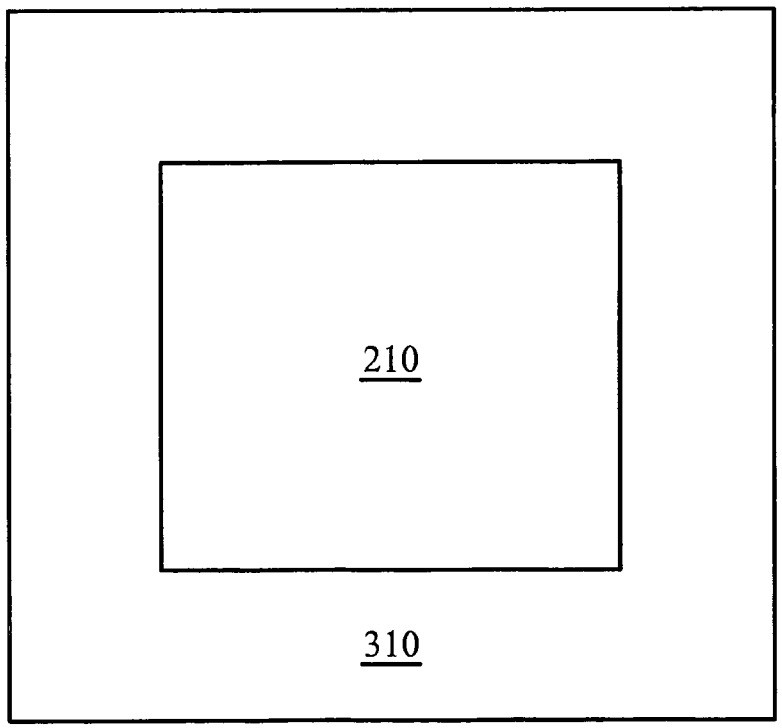

A portion of the structure illustrated in FIG. 4a is shown in plan view in FIG. 4b. As shown in FIG. 4b, the trench 305 and dielectric 310 completely surround the SOI island 210. The isolation dielectric 310 may comprise CVD silicon oxide. It may also comprise a combination of materials, such as CVD silicon oxide, silicon nitride, silicon oxy-nitride, high-k dielectrics, low-k dielectrics, CVD poly-silicon, or other dielectrics. The structure of FIGS. 4a and 4b is planarized and device fabrication is completed according to conventional methods.

Figure 5:
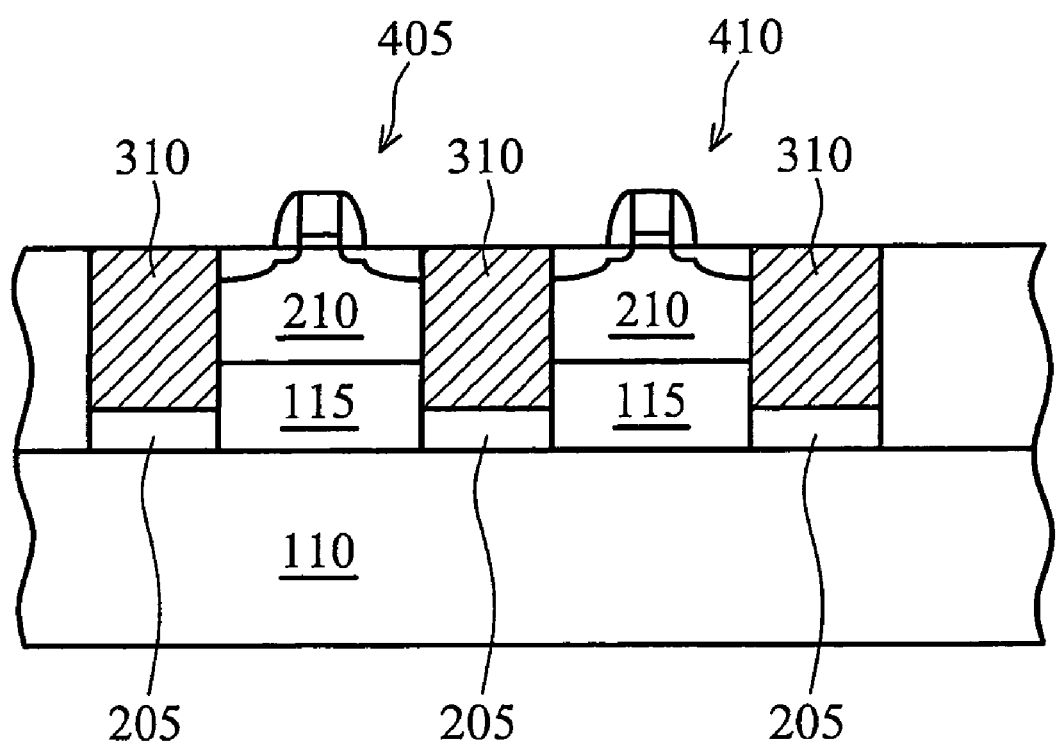
FIG. 5 is a cross sectional view of NMOS and PMOS transistors formed on SOI epilayers according to embodiments of the invention.

For example, shown in FIG. 5 is an exemplary embodiment wherein an NMOS transistor 405 is formed in a first SOI island region 130a, and a PMOS device 410 is formed in a second island region 130b by in part implanting impurities into at least portions of the second epitaxial layer.

The epitaxial layers 210 may be between about 2 to 200 nm thick and preferably about 40 nm thick. The epitaxial layers 210 (and the substrate) preferably comprise silicon, but it may also comprise SiC, Ge, GaAs, GaAlAs, InP, GaN, or other semiconductor material, or a combination thereof. The dielectric layer 115, which acts as a buried oxide (BOX) layer, may have a thickness between about 10 to 200 nm, preferably about 50 nm.

NMOS 405 and PMOS 410 device preferably include a gate dielectric such as silicon oxide having a thickness from about 6 to 100 Å, and more preferably less than about 20 Å. In other embodiments, the gate dielectric may include a high-k dielectric having a k-value substantially greater than about 7. Possible high-k dielectrics include $Ta_2O_5$, $TiO_2$, $Al_2O_3$, $ZrO_2$, $HfO_2$, $Y_2O_3$, $L_2O_3$, and their aluminates and silicates. Other suitable high-k gate dielectrics may include a hafnium-based materials such as $HfO_2$, $HfSiO_x$, $HfAlO_x$.

One exemplary combination includes the addition of a stress-inducing film to enhance carrier mobility. For example, those skilled in the art know that it is desirable to induce a tensile strain in the channel of n-channel transistors in the source to drain region. It is also desirable to induce a compressive strain in the channel of p-channel transistors in the same direction.

When the strain is applied to both PFETs and NFETs with <110> channels, the NFET and PFET channels might be preferably non-parallel to avoid stress induced degradation in either NFET or PFET. It is known that tensile stress is beneficial for NFET, but for PFET, the compressive stress is preferred. Thus, choosing proper crystal orientations in which one is stress-sensitive and the other is stress-insensitive is a way to resolve this dilemma of strain effect on NFET and PFET.

Strain-inducing STI regions 125 may also be optimized to selectively induce stress in n-channel and p-channel transistors separately. For example, a first isolation trench includes a first liner, and a second isolation trench includes a second liner, or none at all. By way of example, a liner may be a nitride layer. The second trench may be lined with a nitride layer that has been modified, e.g., implanted with ions or removed. In another example, the first material can be an oxynitride (a nitrided oxide). In this case, the second trench may be lined with an oxide liner or no liner at all, as examples. A liner can then be modified in some but not all of the plurality of trenches.

Although the present invention and its advantages have been described in detail, it should be understood that various changes, substitutions and alterations may be made herein without departing from the spirit and scope of the invention as defined by the appended claims. For example, many of the features and functions discussed above may be implemented with other semiconductor technology. Examples of other technologies combinable with embodiments include additional devices such as guard rings, scrap lines, seal rings, metal pads, bipolar transistors, or diodes on substrates of single orientation.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method of forming a semiconductor device comprising:
    forming a dielectric layer over a substrate;
    patterning the dielectric layer to form a trench therein;
    epitaxially growing a first epitaxial layer in the trench while preventing growth of the first epitaxial layer on the dielectric layer;
    epitaxially growing a second epitaxial layer on said first epitaxial layer, wherein the second epitaxial layer extends over the dielectric layer;
    electrically isolating the second epitaxial layer that extends over the dielectric layer from the first epitaxial layer; and
    forming an integrated circuit device disposed in the second epitaxial layer and directly over the dielectric layer.

2. The method of claim 1 further comprising:
    planarizing the first and second epitaxial layers.

3. The method of claim 1, wherein the electrically isolating the second epitaxial layer from the first epitaxial layer comprises:
    etching a second trench in the first epitaxial layer; and
    filling the trench with a dielectric material.

4. The method of claim 3 wherein the second trench is etched completely through the first epitaxial layer.

5. The method of claim 1 wherein the first epitaxial layer comprises a material selected from the group consisting essentially of silicon, germanium, carbon, and combinations thereof.

6. The method of claim 1 further comprising doping select regions of the second epitaxial layer with an impurity.

7. The method of claim 1 wherein the first epitaxial layer is grown using a silane-based precursor.

8. The method of claim 1 wherein epitaxially growing a first epitaxial layer in the trench comprises overfilling the trench, such that a portion of the first epitaxial layer extends above sidewalls of the trench.

9. A method of forming a semiconductor device comprising:
provided a substrate;
forming a dielectric layer on the substrate;
patterning the dielectric layer to form therein a first trench;
filling the first trench with a first epitaxially grown semiconductor material;
using the first epitaxially grown semiconductor material as a nucleation site for an additional epitaxially grown semiconductor material, wherein the additional epitaxially grown semiconductor material extends over the dielectric layer;
forming a second trench extending through at least a portion of the first epitaxially grown semiconductor material past a top surface of the dielectric layer; and
filling the second trench with a dielectric material.

10. The method of claim 9 further comprising:
planarizing the first epitaxially grown semiconductor material and the additional epitaxially grown semiconductor material, wherein a portion of the additional epitaxially grown semiconductor material remains extending over the dielectric layer.

11. The method of claim 9 wherein the substrate is a silicon wafer.

12. The method of claim 9 wherein the dielectric layer is thermally grown silicon oxide.

13. The method of claim 9 wherein the first epitaxially grown semiconductor material is selected from the group consisting essentially of silicon, silicon germanium, silicon carbon, gallium arsenide, and combinations thereof.

14. The method of claim 9 further comprising implanting impurities into at least portions of the additional epitaxially grown semiconductor material.

15. The method of claim 9 wherein the first epitaxially grown semiconductor material and the additional epitaxially grown semiconductor material comprise the same material.

16. A method of forming a semiconductor device comprising:
providing a substrate;
forming a dielectric layer on the substrate;
patterning the dielectric to form therein a trench;
filling the trench with a first epitaxially grown semiconductor material;
using the first epitaxially grown semiconductor material as a nucleation site for an additional epitaxially grown semiconductor material, wherein the additional epitaxially grown semiconductor material extends over the dielectric layer; and
substantially removing the first epitaxially grown semiconductor material and forming a second dielectric material in its place adjoining the additional epitaxially grown semiconductor material.

17. The method of claim 16 wherein a portion of the first epitaxially grown semiconductor material remains beneath the second dielectric material.

18. A method of forming a semiconductor device comprising:
providing a silicon containing substrate;
forming a silicon oxide layer on the substrate;
forming a first opening in the silicon oxide layer to expose a region of underlying substrate;
epitaxially growing a first silicon containing material on the exposed region of underlying substrate while precluding formation of the first silicon containing material on the silicon oxide layer;
epitaxially growing a second silicon containing material on the first silicon containing material, the second silicon containing material substantially covering the silicon oxide layer;
removing a portion of the first silicon containing material to form a second opening;
filling the second opening with a dielectric material; and
forming an integrated circuit device disposed in the second silicon containing material.

19. The method of claim 18 wherein the silicon oxide layer is thermally grown.

20. The method of claim 18 further comprising planarizing the second silicon containing material.

* * * * *